United States Patent [19]

Merrill

[11] Patent Number: 5,705,846
[45] Date of Patent: Jan. 6, 1998

[54] CMOS-COMPATIBLE ACTIVE PIXEL IMAGE ARRAY USING VERTICAL PNP CELL

[75] Inventor: Richard Billings Merrill, Daly City, Calif.

[73] Assignee: National Semiconductor Corporation, Santa Clara, Calif.

[21] Appl. No.: 509,421

[22] Filed: Jul. 31, 1995

[51] Int. Cl.[6] .......................... H01L 31/06; H01L 31/062; H01L 31/113; H01L 27/082
[52] U.S. Cl. .......................... 257/462; 257/592; 257/291
[58] Field of Search .......................... 257/462, 233, 257/291, 588, 592

[56] References Cited

U.S. PATENT DOCUMENTS

| | | | |
|---|---|---|---|
| 4,531,282 | 7/1985 | Sakai et al. | 257/592 |
| 4,866,291 | 9/1989 | Shimada et al. | 257/291 |
| 5,065,206 | 11/1991 | Nishizawa et al. | 257/462 |
| 5,243,216 | 9/1993 | Noguchi et al. | 257/462 |
| 5,289,023 | 2/1994 | Mead | 257/291 |

*Primary Examiner*—Stuart S. Levy
*Assistant Examiner*—Adriana Giordana
*Attorney, Agent, or Firm*—Limbach & Limbach L.L.P.

[57] ABSTRACT

A preferred pnp bipolar phototransistor pixel element in accordance with the present invention has a p-type collector region formed in p-type semiconductor material. An n-type base region is formed in the collector region. A p-type emitter region is formed in the base region. An annular n-type capacitor region is formed in the base region surrounding and spaced-apart from the emitter region. Conductive material is disposed over the capacitor region and separated therefrom by underlying dielectric material to define the pixel element's coupling capacitor.

4 Claims, 1 Drawing Sheet

CMOS-COMPATIBLE ACTIVE PIXEL IMAGE ARRAY USING VERTICAL PNP CELL

BACKGROUND OF INVENTION

1. Field of the Invention

The present invention relates to imaging sensors and, in particular, to an active pixel sensor array that is based upon a vertical pnp phototransistor and is fully compatible with commonly-available complementary-metal-oxide-semiconductor (CMOS) process technology.

2. Discussion of Related Art

Eric Fossum, "Active-Pixel Sensors Challenge CCDs", Laser Focus World, pp. 83–87, June 1993, discusses emerging active-pixel sensor technology that is poised to replace charge coupled device (CCD) technology in many imaging applications.

As discussed by Fossum, a CCD relies on charge shifting to read out an image. Since it is very difficult to achieve 100 % charge transfer efficiency in a CCD structure, performance is sometimes degraded below acceptable levels. CCDs are also very power intensive and have complex fabrication requirements.

In contrast to CCD technology, active pixel sensors operate like a random access memory (RAM), with each pixel containing its own selection and readout transistors. The signal readout then takes place over conductive wires rather than by shifting charge. Thus, active pixel sensor technology improves on CCD technology by providing random access, nondestructive readout and by being easily integrated with on-chip drive and signal processing circuitry.

U.S. Pat. No. 5,289,023, issued Feb. 22, 1994, to Carver A. Mead, discloses an active pixel sensor cell that uses a npn bipolar phototransistor as both an integrating photosensor and a select device. In Prof. Mead's preferred embodiment, the phototransistor is a vertical structure having its collector disposed in a substrate of N-type silicon. The base terminal of the bipolar phototransistor, which comprises a p-doped region disposed within the collector region, is utilized as the select node for the pixel. Conventional field oxide regions are employed to isolate the base regions of adjoining phototransistors. An n-doped polysilicon line is disposed over the surface of the substrate and is insulated therefrom except in regions where it is in contact with the p-doped base regions. Where the n-doped polysilicon is in contact with the surface of the p-type base region, it forms an n+ epitaxial region that serves as the emitter of the phototransistor. The polysilicon line provides the emitter contact.

As further disclosed in the '023 patent, a plurality of the Mead phototransistors may be arranged in an array of rows and columns. The bases of all phototransistors in a row of the array are capacitively coupled together to a common row-select line, and the emitters of all phototransistors in a column are integral with a column sense line. The input of a sense amplifier is connected to the sense line of each column of integrating photosensors. The sense line is connected to the inverting input of an amplifying element of an integrating sense amplifier. A capacitor, preferably a varactor, is also connected between the inverting input and the output of the amplifying element. Exponential feedback is provided in the sense amplifier for signal compression at high light levels. The outputs of the sense amplifiers are connected to sample/hold circuits. The rows of the array are selected one at a time and the outputs of the sample/hold circuits for each row are scanned out of the array while the pixel data for the next row are sampled.

U.S. Pat. No. 5,289,023 is hereby incorporated by reference in its entirety to provide additional background information regarding the present invention.

Because the imager disclosed in the '023 patent exhibits high sensitivity at low light levels, operates at a wider dynamic range than can be achieved with CCDs and requires a relatively small cell area, it offers great promise for the future. However, the current technology has some drawbacks. The output of the active pixel reflecting the integrated photocurrent is directly proportional to the beta of the npn poly-emitter bipolar transistor. Since there is no way to correct for this effect, the dynamic range of the cell may be limited by beta matching among the 1 M-plus devices included in the array. Historically, it has been difficult to achieve good beta matching in poly-emitter transistors.

Also, the active pixel disclosed in the '023 patent uses a vertical npn transistor with an N-type wafer as the collector. Because of well-known technical problems, N-type wafers are non-industry standard for CMOS technology. Although a P-type wafer with an n-buried layer could be used, n-buried layers require complex processing and might result in increased pixel leakage, a critical issue.

SUMMARY OF THE INVENTION

The present invention provides an active pixel sensor element that is based upon a vertical pnp phototransistor and is fully compatible with core CMOS processes. The cell design also features a poly/n+ coupling capacitor that achieves high coupling ratios (~90%) while parasitic capacitance on the base is very low. The design does not use poly emitters and, therefore, provides better beta matching than known active pixel sensors. The device can be fabricated in normal P-type wafers, this avoiding the need for n-buried layers.

A preferred pnp bipolar phototransistor pixel element in accordance with the present invention has a p-type collector region formed in P-type semiconductor material. An n-type base region is formed in the collector region. A p-type emitter region is formed in the base region. An annular n-type capacitor region is formed in the base region surrounding and spaced-apart from the emitter region. Conductive material is disposed over the capacitor region and separated therefrom by underlying dielectric material, thus defining the coupling capacitor of the pixel element.

Other features and advantages of the present invention will become apparent and be appreciated by reference to the following detailed description which should be considered in conjunction with the accompanying drawings.

DETAILED DESCRIPTION OF THE INVENTION

Figure 1:
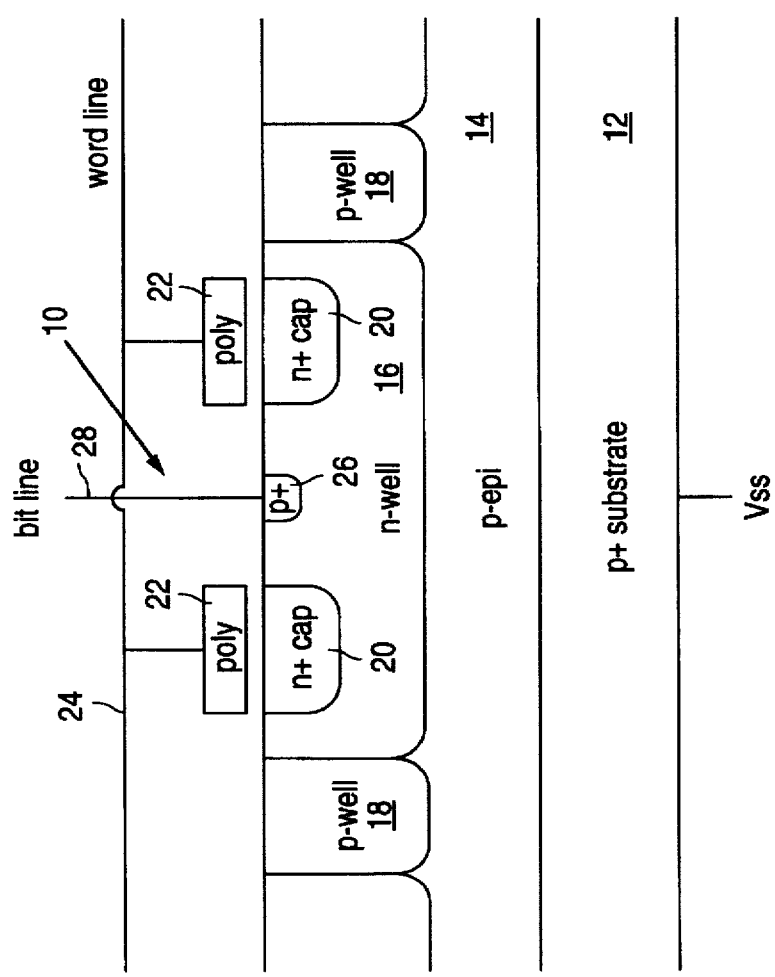
FIG. 1 is a cross-section view illustrating a vertical pnp bipolar phototransistor pixel element in accordance with the present invention.

FIG. 1 shows a cross-sectional view of a vertical pnp phototransistor pixel element 10. Fabrication of the pixel element 10 can be achieved utilizing any common core CMOS process with the addition of a capacitor module. The following discussion is directed to elements of a twin well CMOS process flow utilizing conventional P–/P+ Epi, (100) silicon starting material.

To form the twin well structure, a pad oxide about 450 Å thick is formed on the surface of the p-epi layer 14. A nitride layer about 1350 Å thick is then formed on the pad oxide layer. A twin well mask is then used to define the n-well regions and to etch the exposed nitride. An n-well implant is then performed using a n-type dopant, for example, phosphorous at 1.0 E13, 140 keV to define n-well regions 16. A subsequent selective oxidation step at 950° C. results in a growth of silicon dioxide about 5000 Å thick on the surface of the n-well region 16. The remaining nitride layer is then stripped and a p-well implant is performed using, for example, $BF_2$ at 6.3 E12, 150 keV, to define p-well regions 18. The twin well module is completed by selectively etching back the oxide on the n-wells 16 and p-wells 18 at about 1100° C. and stripping the oxide resulting from the drive-in step.

Those skilled in the art will appreciate that the normal core CMOS process flow would now continue with implementation of a field oxide isolation module to define CMOS device active areas in both the n-well regions 16 and the p-well legions 18 and then with the formation of the CMOS device elements. As illustrated in FIG. 1, in accordance with the invention, selected n-well regions 16 serve as the base regions of the vertical pnp phototransistor pixel elements 10 of an active pixel image array, the p-epi layer 14 serving as the phototransistor collector. The peripheral CMOS devices will be utilized to form, for example, control circuitry and signal processing circuitry utilized in conjunction with the pixel image array. The process steps described below, with the exception of the capacitor module, are selected from the conventional core CMOS process flow to complete the phototransistor pixel element structure 10.

With continuing reference to FIG. 1, before proceeding with the CMOS process flow, a capacitor module is used to define n+ capacitor regions 20 in the n-well base regions 16 by implanting n-type dopant, for example, phosphorous at 5 E15, 150keV. An inter-plate oxide layer about 200–300 Å thick is then formed over the n+ capacitor regions 20.

The process then reverts back to the normal core CMOS flow which results in deposition of a polysilicon layer about 3250 Å thick. In the poly etch step of the core process, the polysilicon over the n+capacitor regions is defined to provide the poly upper plates 22 of the coupling capacitors of the pixel element 10. As shown in FIG. 1, the poly plates 22 are connected to the word line 24 that defines a row of pixel elements 10 in the imaging array.

A subsequent implant of p-type dopant, for example, $BF_2$ at 3.5 E15, 45 keV, is used to define the p+ emitter regions 26 of the vertical pnp phototransistor element 10. As shown in FIG. 1, the emitter region 26 is connected to a bit line 28 that defines a column of pixel elements 10 in the imaging array.

Figure 2:
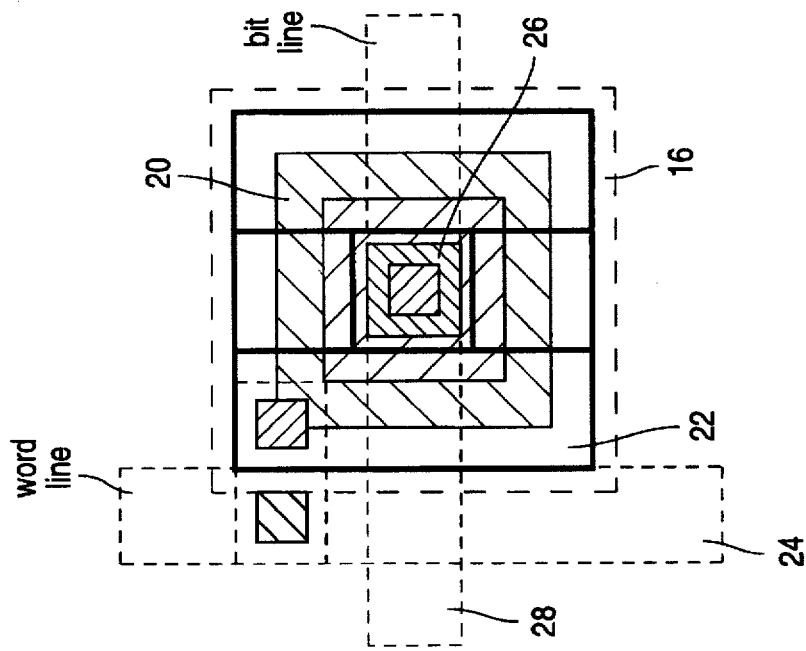
FIG. 2 is a plan view illustrating a vertical pnp bipolar phototransistor pixel element in accordance with the present invention.

FIG. 2 shows a layout of the FIG. 1 pixel element structure. As shown in FIG. 2, in the illustrated embodiment, the n+ capacitor region 20 is formed in an annular shape that surrounds the emitter region 24.

The above-described pnp active pixel element 10 operates as follows. The p-substrate is always at 0V, as is typical for CMOS devices. During reset, the word line 24 is taken from +5V to 0V. The n-well 16, i.e., the pnp base, is capacitively coupled through the poly/n+ capacitor negative as well, turning on the vertical pnp, the emitter 26 of which is held to a positive voltage (+5) by external circuitry on the bit line 28. The floating base 16 ends up at a potential no less than Vcc−Vbe (4.4V).

After this reset, the word line 24 is taken back to +5V, which again capacitively couples the pnp base 16, but now reverse biases the pnp emitter/base junction. The reverse biased emitter/base junction acts as the collector for the photocurrent. After reset, the base 16 is sitting at about +8V. When an electron/hole pair is generated by an incident photon, the holes will be collected by the p-type and relatively negative emitter 26 and collector 14, while the electrons will remain in the base 16 and cause it to become incrementally more negative. The negative charge will continue to accumulate during the photointegration period and the base 16 will drift negative. Of course, it may not drift below the emitter potential (+5V) or charge will be lost. Therefore, care must be taken to limit exposure accordingly.

When reset is again applied at the end of the integration period, the negative charge accumulated at the base 16 is dumped into the emitter 26 and integrated in the bit line sense amplifiers to form a voltage corresponding to the integrated photocurrent.

The above-described operation is much like that described in the '023 patent except that the patent refers to an npn device while this is a pnp device.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A vertical pnp bipolar phototransistor pixel element comprising:

a collector region formed of semiconductor material of p-type conductivity;

a base region of n-type conductivity formed in the collector region the base region having a first conductivity;

an emitter region of p-type conductivity formed in the base region;

a capacitor region of n-type conductivity formed in the base region in spaced-apart relationship to the emitter region the capacitor region having a second conductivity that is greater than the first conductivity;

dielectric material formed on a surface of the capacitor region; and conductive material formed on the dielectric material above the capacitor region to be capacitively coupled to the capacitor region.

2. A phototransistor pixel element as in claim 1 wherein the capacitor region comprises a generally annular shape that surrounds the emitter region.

3. A phototransistor pixel element as in claim 1 wherein the dielectric material comprises silicon dioxide about 200–300 Å thick.

4. A phototransistor pixel element as in claim 3 wherein the conductive material comprises polysilicon about 3250 Å thick.

* * * * *